(12) United States Patent
Yang

(10) Patent No.: US 7,656,679 B2
(45) Date of Patent: Feb. 2, 2010

(54) MULTI-LAYER SUBSTRATE AND MANUFACTURE METHOD THEREOF

(75) Inventor: Chih-kuang Yang, Hsin-Chu (TW)

(73) Assignee: Princo Corp., Hsinchu (TW)

( * ) Notice: Subject to any disclaimer, the term of this patent is extended or adjusted under 35 U.S.C. 154(b) by 7 days.

(21) Appl. No.: 11/972,554

(22) Filed: Jan. 10, 2008

(65) Prior Publication Data

US 2008/0316726 A1 Dec. 25, 2008

(30) Foreign Application Priority Data

Jun. 20, 2007 (TW) ............... 96122144 A

(51) Int. Cl.
*H05K 7/00* (2006.01)
(52) U.S. Cl. .................. 361/783; 438/497
(58) Field of Classification Search .......... 361/783; 438/497

See application file for complete search history.

(56) References Cited

U.S. PATENT DOCUMENTS 5,768,109 A * 6/1998 Gulick et al. ............ 361/794
6,881,654 B2 * 4/2005 Chen et al. ............... 438/497
2007/0218686 A1 * 9/2007 Wang et al. ............... 438/675

FOREIGN PATENT DOCUMENTS

| CN | 1180461 C | 12/2004 |
|----|-----------|---------|
| CN | 1221027 C | 9/2005 |
| CN | 1284431 C | 11/2006 |
| JP | 2005-243990 A | 9/2005 |
| JP | 2005-244108 A | 9/2005 |
| JP | 2005-347308 A | 12/2005 |

* cited by examiner

*Primary Examiner*—Dean A. Reichard
*Assistant Examiner*—Andargie M Aychillhum

(57) ABSTRACT

Disclosed are a multi-layer substrate and a manufacture method thereof. The multi-layer substrate of the present invention comprises a surface dielectric layer and at least one bond pad layer. The surface dielectric layer is located at a surface of the multi-layer substrate. The bond pad layer is embedded in the surface dielectric layer to construct the multi-layer substrate with the surface dielectric layer of the present invention. The manufacture method of the present invention forms at least one bond pad layer on a flat surface of a carrier and then forms the surface dielectric layer to cover the bond pad layer where the bond pad layer is embedded therein. After the multi-layer substrate is separated from the carrier, the bond pad layer and the surface dielectric layer construct a flat surface of the multi-layer substrate.

6 Claims, 5 Drawing Sheets

MULTI-LAYER SUBSTRATE AND MANUFACTURE METHOD THEREOF

BACKGROUND OF THE INVENTION

1. Field of the Invention

The present invention generally relates to a multi-layer substrate and manufacture method thereof, and more particularly to a flat surface multi-layer substrate and manufacture method thereof.

2. Description of Prior Art

Miniaturization for electronic productions is an unavoidable trend in this modern world. While the scale of the semiconductor chips is continuously getting smaller, the scale of the related technology for packaging is also inevitably needed to be microminiaturized to follow the scale of the semiconductor chip. Today, because the integration of integrated circuits has been greatly increased, using a multi-layer substrate having high integration for packaging a chip device or an electronic component is necessary to obtain a high performance integration system consequently.

Please refer to FIG. 1, which illustrates a diagram of a multi-layer substrate according to prior art. The surface of the multi-layer substrate is the surface for connecting to a device or an electronic component. Such multi-layer substrate includes a bond pad layer 102, a surface dielectric layer 104 and a solder mask layer 106. The metal layer 108 under the bond pad layer 102 is electrically connected therewithin. According to prior arts, multiple metal layers (not shown) and multiple dielectric layers (not shown) are manufactured by Sequential Lamination method or by Build-up method, but in prior arts, the thickness of the surface dielectric layer 104 is larger then those of the bond pad layer 102 and the metal layer 108.

Generally, the thicknesses of the bond pad layer 102 and the metal layer 108 are only ranged from micrometers to dozens of micrometers, but the thickness of the surface dielectric layer 104 can greatly reach from dozens of micrometers up to 200 micrometers. As shown in FIG. 1, because the metal layer 108 exists under the bond pad layer 102, regardless of the manufacturing method by either the Sequential Lamination method or the Build-up method, the surface dielectric layer 104 having dielectric material layer of a certain thickness will make the bond pad layer on the surface of the multi-layer substrate not flat. As aforementioned, the surface dielectric layer 104 can be thickened up to 200 micrometers and the metal layer 108 is only ranged from micrometers to dozens of micrometers, that the thickness of the dielectric layer 104 is much thicker than that of the metal layer 108. Therefore, in the Sequential Lamination method or the Build-up method of prior arts, some process parameters in the methods may be adjusted to deform the surface dielectric layer 104 to make the flatness thereof into an acceptable range for the package.

However, with greater increase in the integration of integrated circuits, the smaller scale and the electrical performance of the semiconductor chips has to be re-considered. The thicknesses of the bond pad layer 102, the surface dielectric layer 104 and the metal layer 108 have to be smaller accordingly. Decreases of the thicknesses of the bond pad layer 102 and the metal layer 108 are limited for keeping the electrical performance of the transmission signals but decrease of the thickness of the surface dielectric layer 104 seems to be more practicable. PCB industry today has tried to manufacture a surface dielectric layer 104 which is only about ten micrometers. In a practical example, the thickness of the surface dielectric layer 104 comes to such scale of only ten micrometers and the thickness of the metal layer 108 may get smaller as a few micrometers or ten micrometers, whose scale of the thickness become in the same degree, the aforesaid means of deforming the surface dielectric layer 104 will fail to make the flatness thereof into an acceptable range for the package. The surface flatness of the multi-layer substrate inevitably becomes worse.

FIG. 2 illustrates a diagram of a multi-layer substrate connected to a chip device with a Flip-Chip package according to prior art. The multi-layer substrate manufacture of prior art has a dielectric layer 103, the corresponding metal layers 107-1, 107-2, the surface dielectric layer 104 and the corresponding metal layers 108-1, 108-2, 108-3 which are connected with bond pad layers 102-1, 102-2, 102-3 thereabove.

The Flip-Chip package shown in FIG. 2 is a common technique in the package technology today, such that Flip-Chip package is a skill to make the chip device face down to connect contacts 112-1, 112-2, 112-3 on the chip device surface with the bond pad layers 102-1, 102-2, 102-3 by metal bumps 120-1, 120-2, 120-3. The bond pad layers 102-1, 102-2, 102-3 have to connect and match with the contacts (electrodes) 112-1, 112-2, 112-3 precisely one to one. Therefore, in the Flip-Chip package, the multi-layer substrate is fixed in advance on a package tool for aligning the metal bumps 120-1, 120-2, 120-3 of the chip device with the bond pad layers 102-1, 102-2, 102-3 of the multi-layer substrate in precise respective positions. Thereafter, the Flip-Chip package is processed by hot pressing the contacts 112-1, 112-2, 112-3, and the bond pad layers 102-1, 102-2, 102-3, whose respective contacts will precisely connect thereto by respective metal bumps to complete the packaging.

However, because the design of the electric circuit of the multi-layer substrate, there may be metal layers 107-1, 107-2 under the metal layers 108-1, 108-3 but no corresponding metal layer under the metal layer 108-2. Therefore, the height of the bond pad layer 102-2 is lower than the height of the bond pad layers 102-1, 102-3. As the Flip-Chip package is processed, the metal bump 120-2 may fail to bond the bond pad layer 102-2 and the contact 112-2 of the chip device together.

Not only in the Flip-Chip package, but also in other high integration multi-contact package, such as, BGA package, LGA package, or CSP package, even one single metal bump fails to bond the bond pad, the whole package will fail. Therefore, the demand for the flatness and the coplanarity of the multi-layer substrate or the metal bump top is more than ever.

Generally, the tolerance of the metal bump can be about ±10 micrometers at 100 micrometers bond height and as aforementioned, with the greater increase of the integration of integrated circuits, the bump pitch also decreases. Furthermore, the bond height decreases accordingly at the same time, and aforesaid tolerance certainly becomes more critical. Consequently, the flatness of the multi-layer substrate surface (or the coplanarity of the bond pad layer and the surface dielectric layer) has to be more accurate. General thickness of the metal layer is about dozens of micrometers, even a few micrometers, and if the surface of the multi-layer substrate can not be flat enough, the yield and the reliability of the Flip-Chip package can be affected critically.

Therefore, a Flip-Chip package or other high integration multi-contact package can be benefited by a flat surface multi-layer substrate. A better package reliability can be obtained and bump height can be decreased further to increase the integration of the entire package.

SUMMARY OF THE INVENTION

An objective of the present invention is to provide a multi-layer substrate and a manufacture method thereof to improve a flatness of at least one bond pad layer and a surface dielectric layer of the multi-layer substrate to raise package yield and package reliability and to increase the integration of the package further.

The surface dielectric layer is located at a surface of the multi-layer substrate. The bond pad layer is embedded in the surface dielectric layer to construct the multi-layer substrate with the surface dielectric layer of the present invention.

The multi-layer substrate of the present invention comprises a surface dielectric layer and at least one bond pad layer. At least one lateral of the bond pad layer bonds closely with the surface dielectric layer. The top surface of the bond pad layer and the top surface of the surface dielectric layer own a coplanarity and the coplanarity makes the multi-layer substrate fixed on a package tool to have a better flatness. When the multi-layer substrate of the present invention is employed to connect with a chip device, the yield and the reliability of the package can be raised.

To accomplish the above objects, the present invention provides a manufacture method comprising steps of:

forming at least one bond pad layer on a flat surface of a carrier;

forming a surface dielectric layer, covering the bond pad layer, and embedding the bond pad layer therein to construct the multi-layer substrate; and separating the multi-layer substrate from the carrier.

The flat surface of the multi-layer substrate is employed to connect to a device, i.e. to connect the bond pad layer with a contact of the device. The device can be a chip device and the connection can be a Flip-Chip package. By forming at least one bond pad layer and then the surface dielectric layer on a flat surface of a carrier, the bond pad layer is embedded in the surface dielectric layer. The bond pad layer and the surface dielectric layer own a coplanarity, therefore, the surface of the multi-layer substrate of the present invention can have a better flatness. Because the integration of integrated circuits has greatly increased, the bump pitch gets smaller. Consequently, the bump height also needs to get smaller. If the multi-layer substrate of the present invention is utilizing the Flip-Chip package or other high integration, multi-point packages, the bumps with smaller bump height can be used for the package. Meanwhile, because of the great flatness of the multi-layer substrate, it can be ensured that the surface of the multi-layer substrate and an exterior of the chip device can be parallel and the gaps therebetween are almost the same. Therefore, the multi-layer substrate of the present invention can raise the package yield and package reliability and thereby increase the integration of the package further.

DETAILED DESCRIPTION OF THE INVENTION

Figure 3:
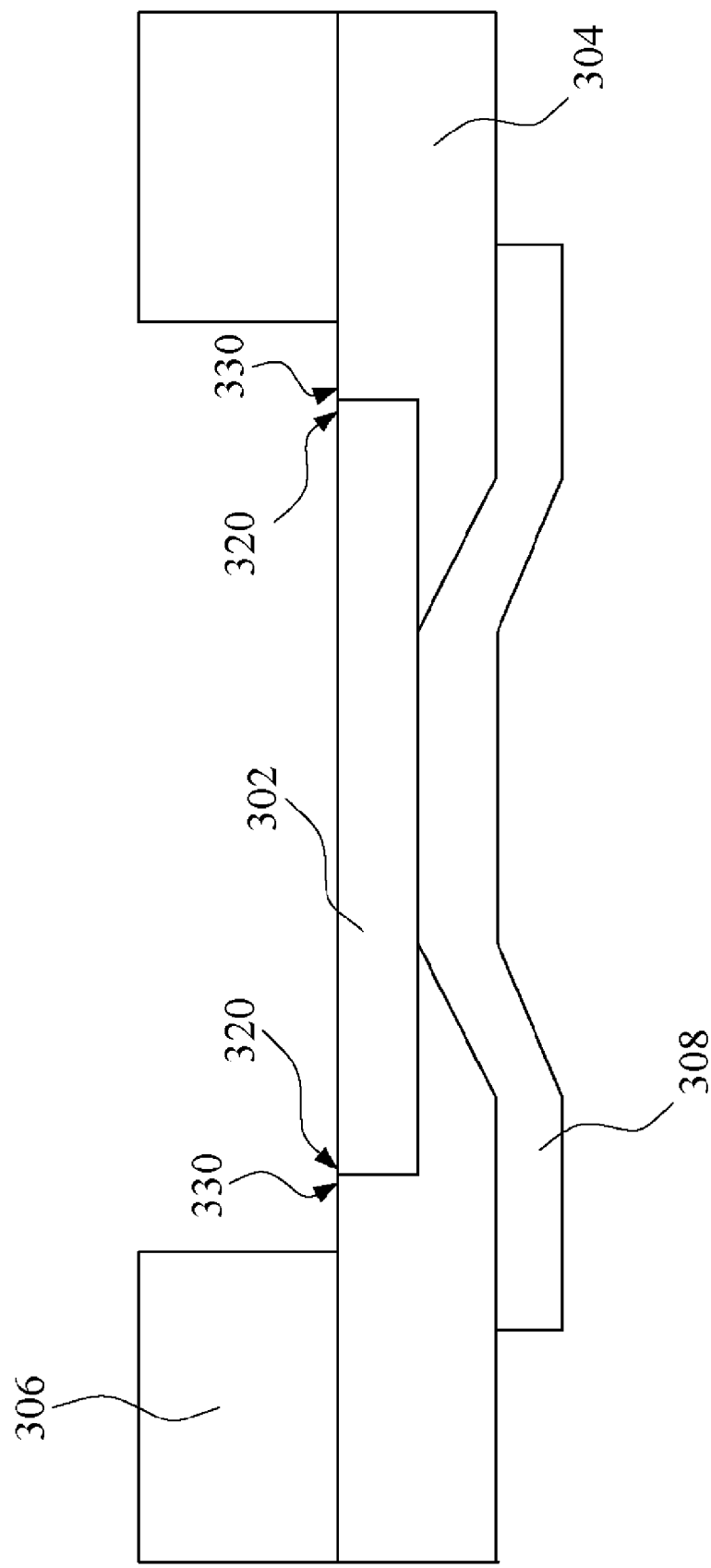
FIG. 3 illustrates a diagram of a multi-layer substrate according to the present invention.

Please refer to FIG. 3, which illustrates a diagram of a multi-layer substrate according to the present invention. The multi-layer substrate of the present invention includes a bond pad layer 302 and a surface dielectric layer 304. Moreover, the multi-layer substrate can further include a solder mask layer 306. Thereunder the bond pad layer 302 is a metal layer 308, and the bond pad layer 302 is embedded in the surface dielectric layer 304, meanwhile, the bond pad layer 302 has at least one lateral and the lateral of the bond pad layer 302 bonds closely with the surface dielectric layer 304 to increase the adhesive force of the bond pad layer 302 to the surface dielectric layer 304. Moreover, the top surface of the bond pad layer 302 and the top surface of the surface dielectric layer 304 own a coplanarity to make the multi-layer substrate surface has a better flatness, i.e. there is no height difference between adjacent edges 320 and 330 of the bond pad layer 302 and the surface dielectric layer 304.

Figure 4A:
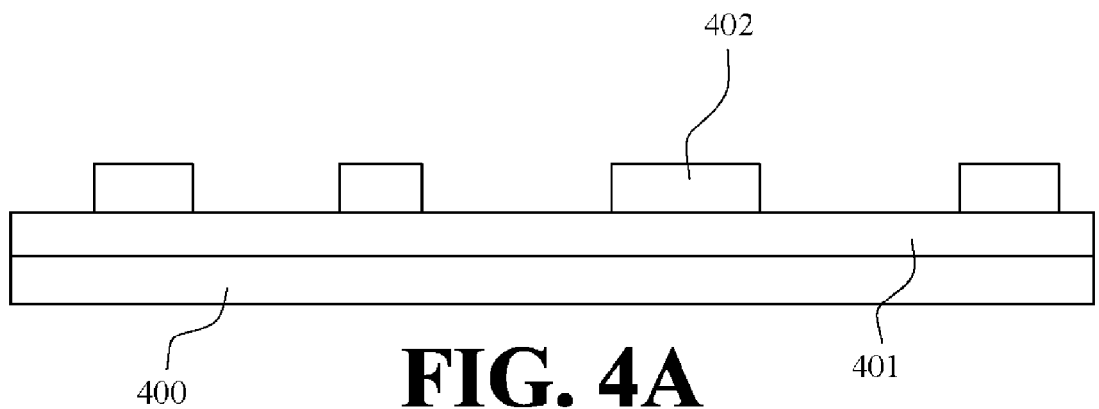
FIG. 4A to 4C show a structural flow chart of a manufacture method for a flat surface multi-layer substrate according to the present invention.
Figure 4B:
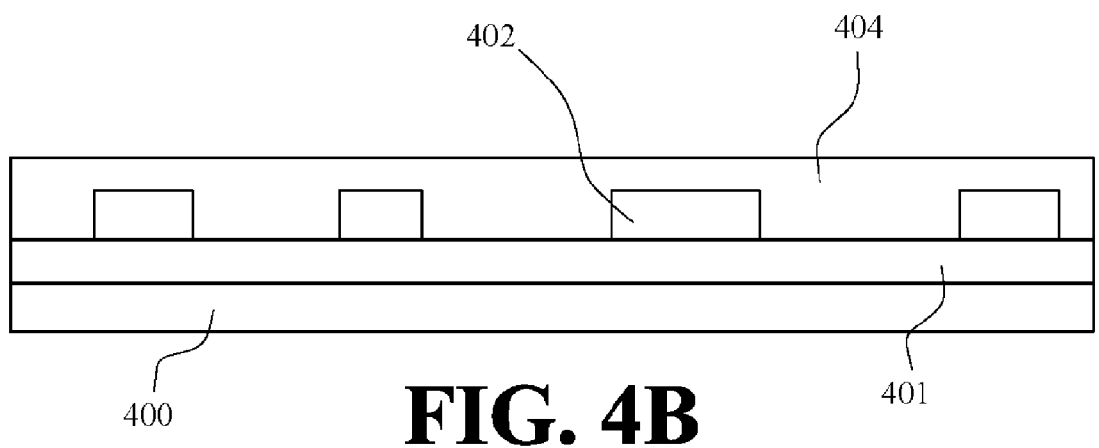
Figure 4C:
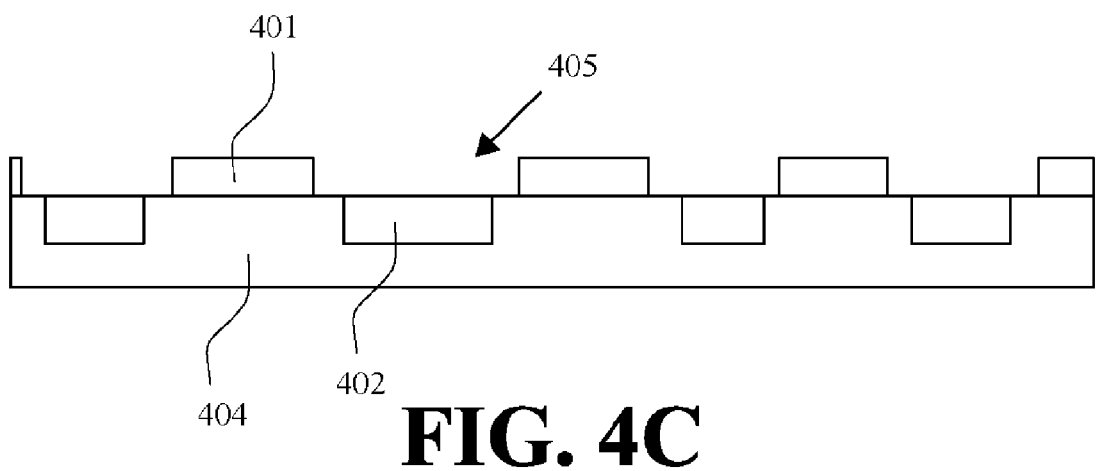

Please refer to FIG. 4A to 4C, which show a structural flow chart of a manufacture method for a flat surface multi-layer substrate according to the present invention. FIG. 4A shows steps of forming a solder mask layer 401 on a flat surface of a carrier 400 and then forming at least one bond pad layer 402 on solder mask layer 401. For example, the carrier 400 can be a silicon wafer which has a great surface flatness and the solder mask layer 401 can be coated on the flat surface of the carrier 400. The bond pad layer 402 can be formed on the solder mask layer 401 by electroplating, lithography etching or etc. FIG. 4B shows a step of forming a surface dielectric layer 404, covering the bond pad layer 402 and embedding the bond pad layer 402 therein. Furthermore, after the surface dielectric layer 404 is formed, several holes can be made to the surface dielectric layer 404 at predetermined positions for a metal layer (above the surface dielectric layer 404, such as the metal layer 308 shown in FIG. 3.) and then more dielectric layers and metal layers can be formed alternately, the multi-layer substrate structure can be obtained. (FIG. 3, FIGS. 4A, 4B and 4C mainly show partial multi-layer substrate.) FIG. 4C shows steps of separating the solder mask layer 401 from the surface of the carrier 400, turning it upside down, and then making a hole to solder mask layer 401 at the position of the bond pad layer 402 to expose thereof (same as the other bond pad layers).

Alternatively, the solder mask layer 401 can be coated on a surface of the multi-layer substrate (the surface which includes the bond pad layer 402 and the surface dielectric layer 404) after the bond pad layer 402 and the surface dielectric layer 404 are separated from the carrier 400. That is, first, the bond pad layer 402 is formed on the surface of the carrier 400 without the solder mask layer 401. In any case, the solder mask layer 401, the bond pad layer 402 and the surface dielectric layer 404 construct the multi-layer substrate of the present invention. Moreover, the method used to separate the multi-layer substrate from the carrier 400 can also be a sacrificial layer or decreasing adhesion intensity of the surface of the carrier 400.

The difference of the present invention from the multi-layer substrates manufactured by Sequential Lamination method or Build-up method according to prior arts is that the multi-layer substrate of the present invention has a better flatness than those of the prior arts. For the Flip-Chip package or other high integration, multi-contact package for increasing the package integration, the aforesaid difference of the present invention leads to a better flatness and greater benefit.

The Sequential Lamination method, the Build-up method, even a coating method of forming the dielectric layer according to prior arts, the surface flatness of the multi-layer substrate inevitably becomes worse because the metal layer exists under the surface dielectric layer. The present invention employs a carrier having a great flatness to form the bond pad layer embedded in the surface dielectric layer, accordingly, a surface of a multi-layer substrate having a great flatness is realized. Due to the great increase of the integration of integrated circuits, even the smaller scale and electrical performance of the semiconductor chips has to be re-considered, the thicknesses of the surface dielectric layer has to be smaller accordingly. The multi-layer substrate of the present invention still can provides a surface structure having a great flatness for the Flip-Chip package or the other high integration, multi-contact package thereafter to raise the yield and the reliability of the packages.

Figure 5:
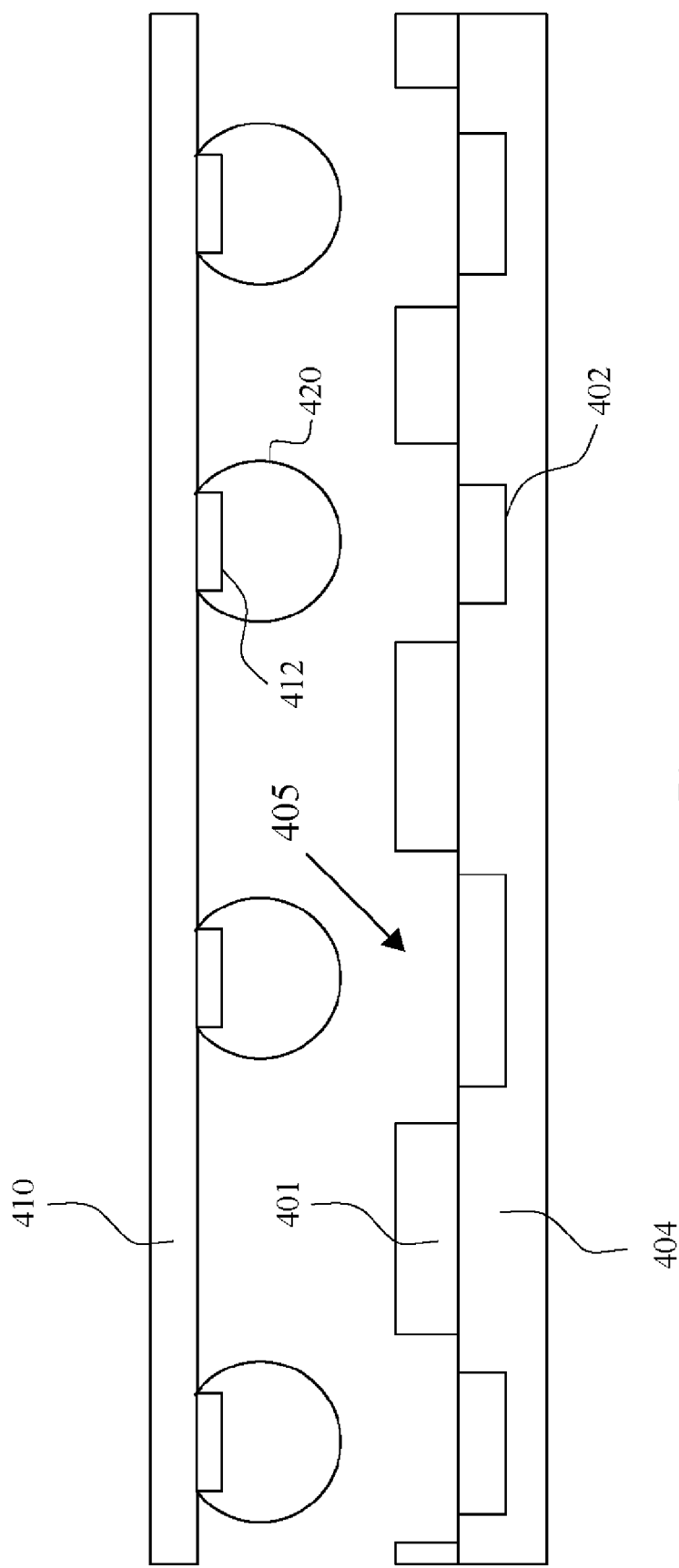
FIG. 5 illustrates a diagram that a multi-layer substrate of the present invention connects to a chip device with a Flip-Chip package according to the present invention.

Please refer to FIG. 5, which illustrates a diagram that a multi-layer substrate connects to a chip device with a Flip-Chip package according to the present invention. In the Flip-Chip package, the surface of the multi-layer substrate having the bond pad layer 402 and the surface dielectric layer 404 (the surface having the solder mask layer 401) is put upward and fixed on a package tool (not shown in FIG. 5). Next, the surface of the chip device 401 is positioned downward to align a metal bump 420 with the bond pad layer 402 (also the other metal bumps and bond pad layers) as shown in FIG. 5. Then, connections (bonding) are processed by hot pressing the contact 412 and the bond pad layer 402 to complete the Flip-Chip package.

Figure 1:
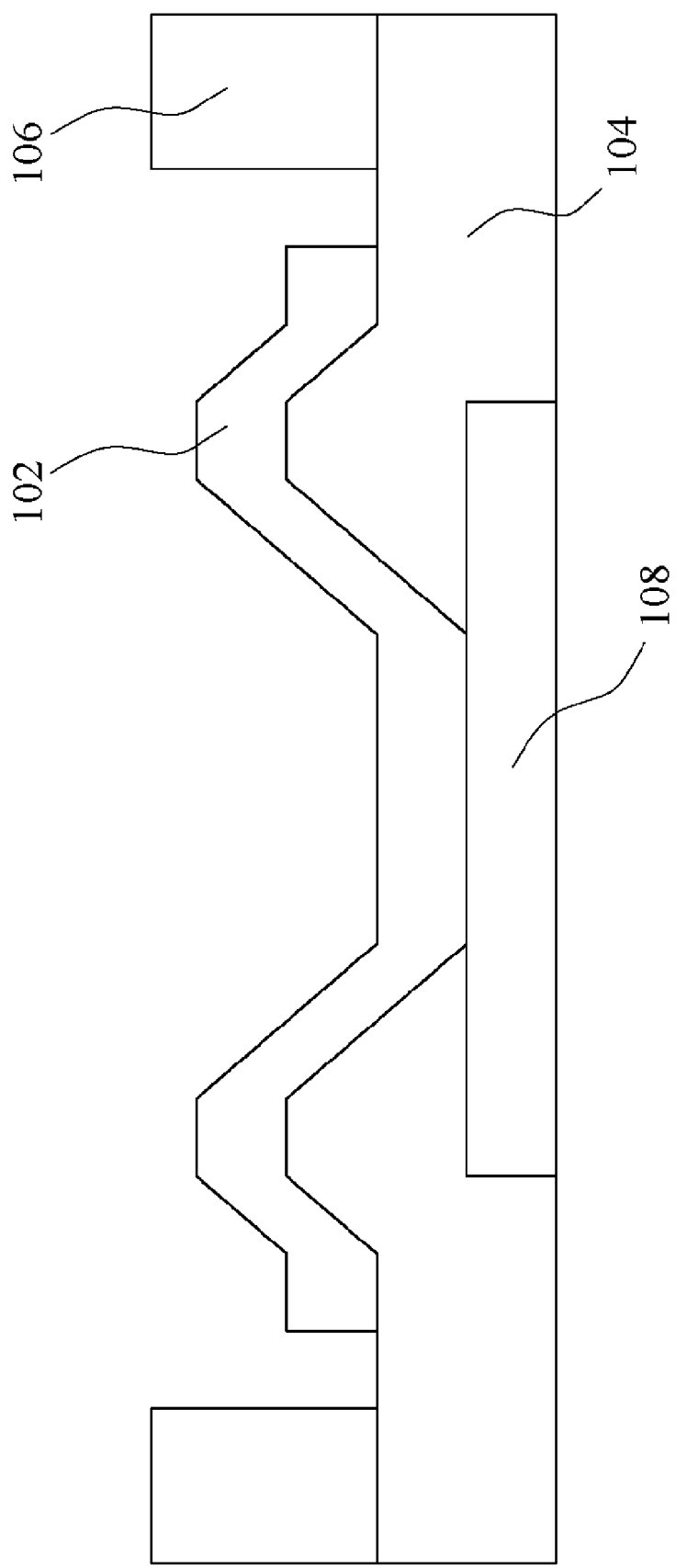
FIG. 1 illustrates a diagram of a multi-layer substrate according to prior art.
Figure 2:
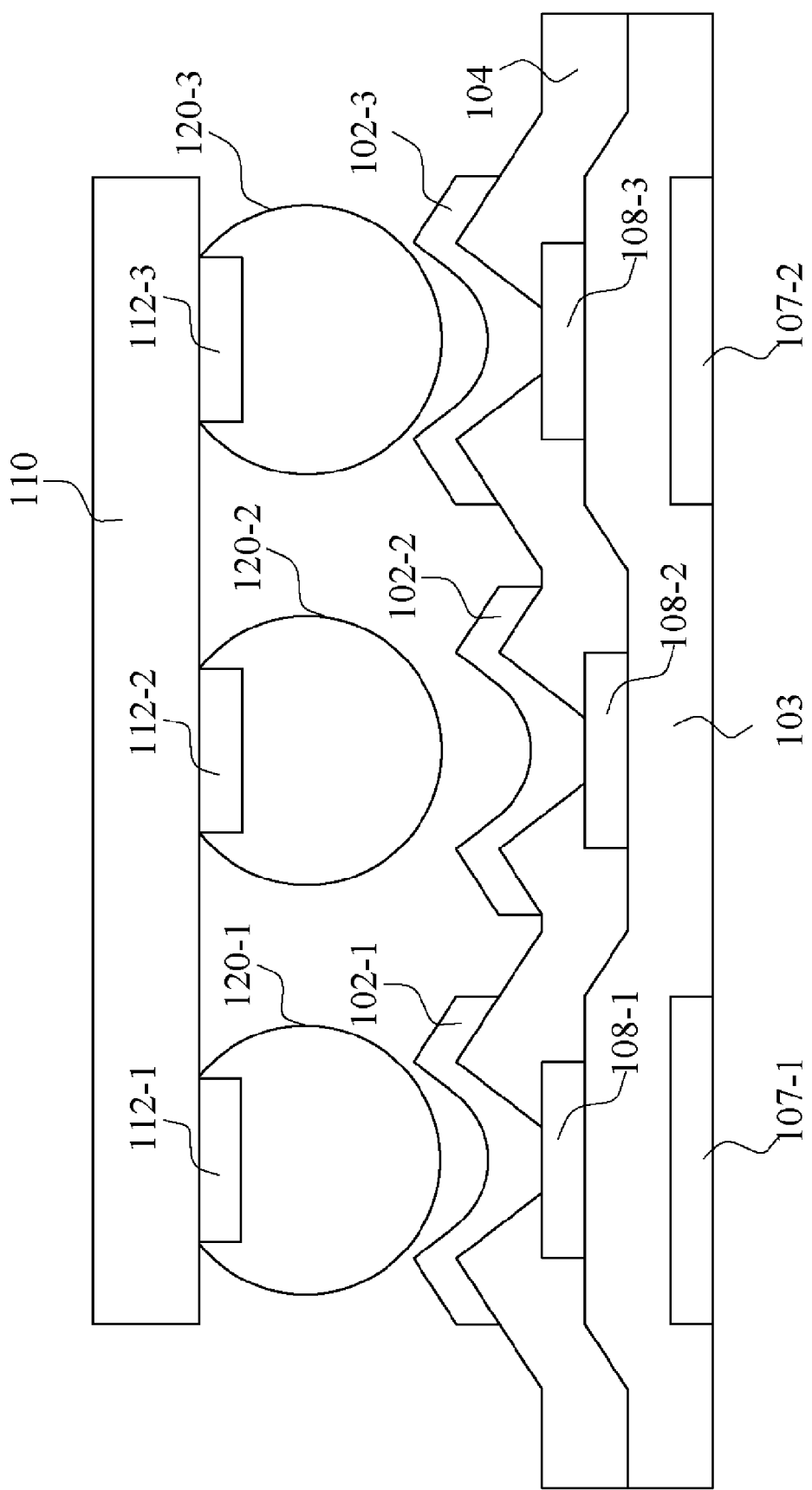
FIG. 2 illustrates a diagram that a general multi-layer substrate connects to a chip device with a Flip-Chip package according to prior art.

The advantage of the multi-layer substrate of the present invention is having a high-flatness surface rather than those manufactured according to prior arts shown in FIG. 2. For the Flip-Chip package, other high integration, multi-contact package, such as, BGA package, LGA package or CSP package, the bump pitch gets smaller with increase of the integration of integrated circuits. Consequently, by employing the multi-layer substrate of the present invention, the metal bumps with smaller bump height can be used in the aforesaid packages. Furthermore, because the surface of the multi-layer substrate of the present invention has a great flatness, that the surface of the multi-layer substrate and the exterior of the chip device (or the electronic component) are parallel and the gaps therebetween are almost the same and can be ensured. All the metal bumps can successfully bond all the bond pad layers 402 and all the contacts 412 (electrodes) of the chip device together. A better package reliability can be obtained and the integration of the whole package can be increased further.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A multi-layer substrate, comprising:
    a surface dielectric layer, located at a surface of the multi-layer substrate; and
    at least one bond pad layer, embedded in the surface dielectric layer and having a top surface and at least one lateral adjacent to the top surface, wherein the lateral of the bond pad layer bonds with the surface dielectric layer, wherein the surface dielectric layer and the bond pad layer construct the multi-layer substrate, and wherein there is no height difference between adjacent edges of the bond pad layer and the surface dielectric layer.

2. The multi-layer substrate of claim 1, wherein the top surface of the bond pad layer and a top surface of the surface dielectric layer own a coplanarity.

3. The multi-layer substrate of claim 1, further comprising a solder mask layer positioned on the top surface of the bond pad layer and the surface dielectric layer, and the solder mask layer has a hole to expose the bond pad layer.

4. The multi-layer substrate of claim 2, wherein the coplanarity makes the surface of the multi-layer substrate flat for connecting to a device.

5. The multi-layer substrate of claim 4, wherein the device is a chip device.

6. The multi-layer substrate of claim 4, wherein the connecting to the device is a Flip-Chip package.

* * * * *